(12) United States Patent
Moss

(10) Patent No.: US 6,597,329 B1
(45) Date of Patent: Jul. 22, 2003

(54) READABLE MATRIX ADDRESSABLE DISPLAY SYSTEM

(75) Inventor: Daniel D. Moss, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/227,447

(22) Filed: Jan. 8, 1999

(51) Int. Cl.[7] ............... G09G 3/20; G09G 3/36; G09G 5/00
(52) U.S. Cl. ............... 345/55; 345/90; 345/204; 345/205
(58) Field of Search .............. 345/55, 667, 856, 345/698, 2, 211.1, 204, 205, 207, 208, 90, 94; 364/670, 671, 419.2

(56) References Cited

U.S. PATENT DOCUMENTS

| | | | | |
|---|---|---|---|---|
| 4,860,117 A | * | 8/1989 | Sasaki | 358/287 |
| 4,908,876 A | * | 3/1990 | DeForest et al. | 382/54 |
| 4,981,340 A | * | 1/1991 | Kurematsu et al. | 350/333 |
| 5,185,859 A | * | 2/1993 | Guttag et al. | 395/164 |
| 5,508,721 A | * | 4/1996 | Hattori | 345/185 |
| 5,577,193 A | * | 11/1996 | Butler et al. | 395/515 |
| 5,612,710 A | * | 3/1997 | Christensen et al. | 345/30 |
| 5,627,557 A | * | 5/1997 | Yamaguchi et al. | 345/90 |
| 5,703,810 A | * | 12/1997 | Nagy | 365/189.05 |
| 5,726,677 A | * | 3/1998 | Imamura | 345/99 |
| 5,805,131 A | * | 9/1998 | Hartmann et al. | 345/101 |
| 5,815,127 A | * | 9/1998 | Jacobs et al. | 345/2 |
| 5,949,428 A | * | 9/1999 | Toelle et al. | 345/431 |
| 6,097,352 A | * | 8/2000 | Zavracky et al. | 345/7 |
| 6,318,633 B1 | * | 11/2001 | Drexler | 235/454 |

FOREIGN PATENT DOCUMENTS

GB        2069739 A    *  8/1981

OTHER PUBLICATIONS

GB 2 069 739 A (Citizen Watch Co Ltd) Aug. 26, 1981.
EP 0 602 623 A1 (NCR INT INC) Jun. 22, 1994.
EP 0 875 881 A2 (Sharp KK) Nov. 4, 1998.
EP 0 875 881 A3 (Sharp KK) Mar. 1, 2000.

* cited by examiner

Primary Examiner—Vijay Shankar
(74) Attorney, Agent, or Firm—Steven P. Skabrat

(57) ABSTRACT

A system having a display device and a processor connected to the display device to read data from and write data to the display device. The display device, such as a matrix addressable display, communicates directly with a processor via a bus, without the need for an intermediate display memory device such as video random access memory (VRAM) or a graphics controller circuit. Information communicated from the processor to the display device is directly presented in a visual fashion. The processor may read the visual information stored in the display device. The display device is able to retain the visual information without the need for continuous refresh operations. Individual pixels of the display may be selectively written by the processor. Since individual pixels may be selectively written, pixels may be written only when their corresponding values have changed, thereby providing better display update performance.

26 Claims, 5 Drawing Sheets

READABLE MATRIX ADDRESSABLE DISPLAY SYSTEM

BACKGROUND

1. Field

The present invention relates generally to computer systems and, more specifically, to computer display system architectures.

2. Description

In many computer systems, an important feature is the ability for the system to display information to a user. In such systems, a display device is included to receive data from other components of the computer system for presentation in a visual form for viewing by the user. Commonly, the display device is a raster display having a cathode ray tube (CRT). Such a display device is by nature "write only." That is, once the data is transferred to the display, it cannot be retrieved.

In current computer systems, a processor typically does not communicate directly with the display device. Instead, in order to display data in current computer systems, the processor typically transfers the data over a bus and through a graphics controller circuit for storage in a graphics memory device. One common graphics memory device is a video random access memory (VRAM). The graphics controller then reads the display data out of the memory and transfers the display data to the display device for presentation to the user. However, the information that is visually presented on a typical display device is transitory in nature. That is, the display device visual image must be continuously refreshed, even if the underlying display data remains unchanged. To refresh the image, the display device must continually receive the display data from the graphics controller circuit. If the processor were to be coupled directly to the display device, this display refresh activity could reduce the time available for the processor to perform other operations. Hence, the graphics controller circuit is typically used in a computer system to update, or refresh, the display data as necessary in order to offload this display updating task from the processor. Thus, when the processor needs to access any information that is being displayed, the processor reads the data from the graphics memory device via the graphics controller circuit. The processor does not directly read data from the display device itself.

When the graphics controller circuit refreshes the display data, it transfers an entire copy of the display data to the display device. An entire copy is transferred although in many instances only a portion of or perhaps even none of the image has changed. Even when the display device is a matrix addressable display, such as a liquid crystal display (LCD), a light emitting polymer (LEP) display, or a reflective silicon display, the display device is refreshed "blind" by a graphics controller circuit. This means that every pixel in the display is re-written on a periodic basis, even if the intensity values of the pixels have not changed since the previous refresh cycle. This mandatory refresh operation adds complexity to the processor/display interface and lowers the effective bandwidth of the display.

Although the inclusion of the graphics controller circuit and the graphics memory device may improve the overall performance of some computer systems, these devices introduce additional cost and complexity to the systems. With the advent of new display technologies, faster buses, and increasingly more powerful processors, a new paradigm for computer display system architectures is desired.

SUMMARY

An embodiment of the present invention is a system having a display device and a processor coupled to the display device to read data from and write data to the display device.

Another embodiment of the present invention is a method operating in a system having a processor coupled to a matrix addressable display device having a plurality of pixels, the method comprising reading display data by the processor from selected individual pixels of the matrix addressable display device.

BRIEF DESCRIPTION OF THE DRAWINGS

The features and advantages of the present invention will become apparent from the following detailed description of the present invention in which.

DETAILED DESCRIPTION

Figure 1:
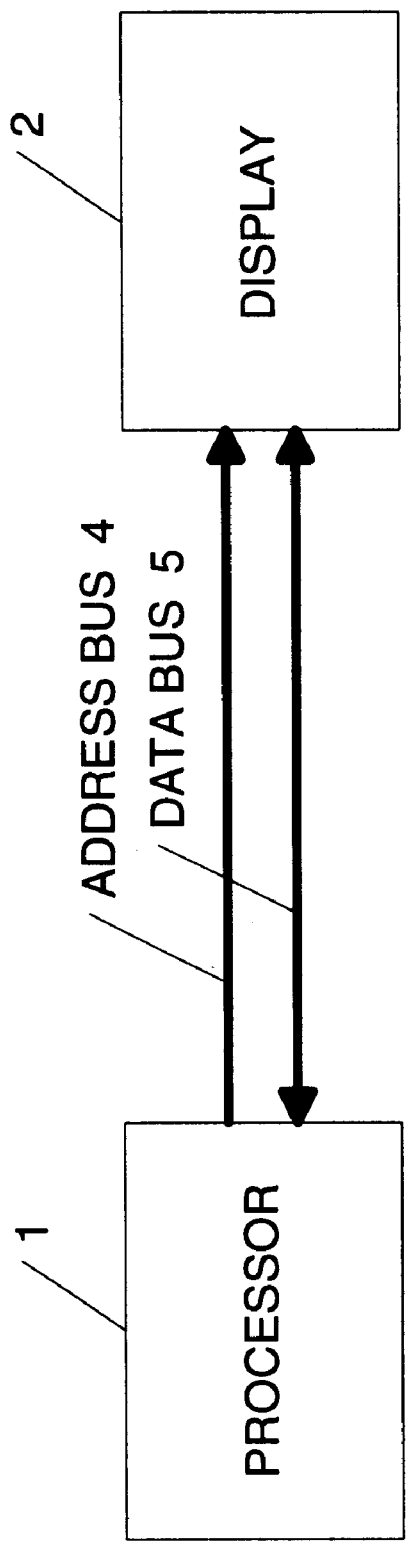
FIG. 1 is a block diagram of a processor coupled to a matrix addressable display device according to an embodiment of the present invention.

An embodiment of the present invention comprises a computer display system architecture having a readable display device and an interface between a processor and the display device. In one embodiment, the display device is a matrix addressable display device, although other types of display devices may be employed. An embodiment of the present invention allows a display device to have display data selectively and directly written to it by a processor, to directly translate the display data into a visible image, to retain the visible image without the need for continual refreshing of the display data, and to allow the processor to selectively read at least a portion of the stored image data.

The display interface of an embodiment of the present invention provides for a processor to directly access a closely-coupled, matrix addressable display device without employing a graphics controller circuit or a graphics memory device. In an embodiment of the present invention, a processor accesses the display via a bus as if it were a block of (pseudo-static) random access memory (RAM). This display system architecture allows the processor to alter or update selected portions of the display while leaving other static areas of the display unaltered. This interface is intended to work with display technologies in which each pixel may be individually accessed via a row and column address, such as a matrix addressable display device, for example. This may include LCDs, light emitting polymer (LEP) displays, reflective silicon displays, and other matrix addressable displays, and may not apply to raster displays such as CRTs.

Current display devices are "write only" because the graphics controller circuit copies information from a graphics memory device to the display device, where it is then represented in a visible form. An embodiment of the present invention comprises a matrix addressable display device that may be selectively readable as well as selectively writable, thereby making the display device itself exhibit the characteristics of a random access memory. This allows the processor to be connected directly to the matrix addressable display device via a bus without the need for a graphics controller or graphics memory device. As used herein, directly connected means being coupled together without a graphics controller or graphics memory device being used. Acceptable display system performance may be maintained at least in part by the throughput capabilities of the bus and the processor, as well as the matrix addressable display device. Additionally, the matrix addressable display device may be "self-refreshing," allowing the processor to update only the portions of the displayed image that have changed. The processor does not have to refresh or update the static portions of the displayed image, because the individual pixels are able to retain their visible image levels without the need for continuous refresh operations Thus, embodiments of the present invention eliminate the need for a graphics controller and a graphics memory device, thereby minimizing the cost of the system, and provide improved data bandwidth between the processor and the display device.

An embodiment of the present invention is based at least in part on the use of a capacitor associated with each pixel in a matrix display. The capacitor may be used to maintain the intensity of the individual pixel. In an embodiment of the present invention, circuitry may be added to the matrix addressable display device to read the charge stored on the capacitor, making the intensity of each pixel selectively readable by the processor coupled to the display.

FIG. 1 is a diagram of a processor coupled to a matrix addressable display device in accordance with one embodiment of the present invention. The processor 1 may be coupled to address bus 4 and to data bus 5. In one embodiment, the processor may be one of the Pentium® family of processors commercially available from Intel Corporation, although other processors may also be used. A matrix addressable display device 2 may be coupled to address bus 4 and data bus 5. The processor 1 may read information from or write information to the display 2 in substantially the same manner as reading information from or writing information to a memory device(not shown). In another embodiment, the address and/or data lines coupling the processor to a memory device may be different than the address and/or data lines coupling the processor to the display device. In yet another embodiment, a buffer device (not shown) may be coupled between the processor, the display and the memory device to handle any differences in throughput between the devices.

Figure 2:
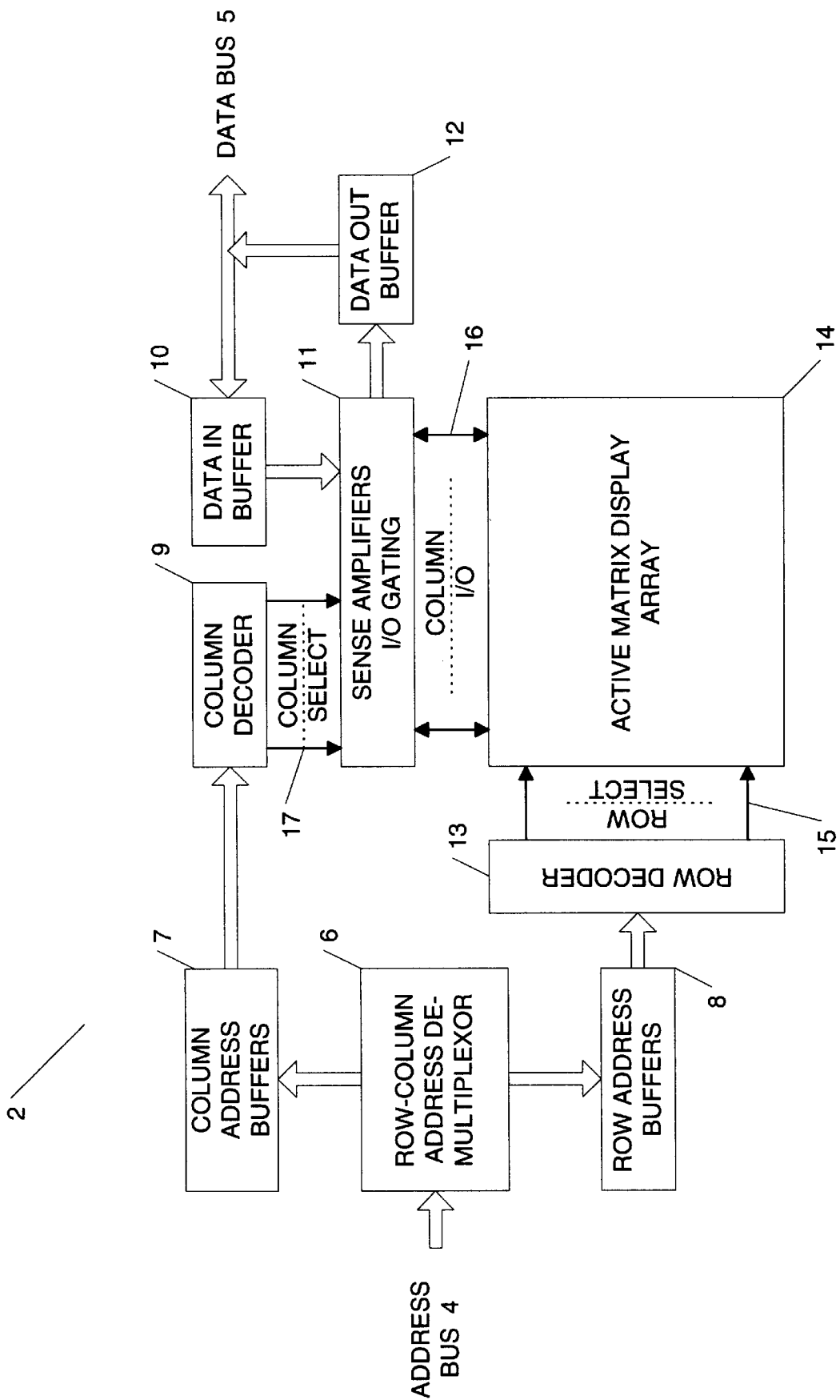
FIG. 2 is a diagram of a matrix addressable display device in accordance with an embodiment of the present invention.

FIG. 2 is a diagram of a display device in accordance with one embodiment of the present invention. Row-column address de-multiplexor 6 receives an address from a processor over address bus 4. The address may be used to select a pixel of the display to be read from or to be written to by the processor. The row-column address de-multiplexor divides the address into at least two portions. A first portion of the address value may be directed to row address buffers 8, where the value of the first portion may be stored as an indication of a selected row of active matrix display array 14. In this embodiment, the first portion comprises the higher order bits of the address. A second portion of the address value may be directed to column address buffers 7, where the value of the second portion may be stored as an indication of a selected column of active matrix display array 14. In this embodiment, the second portion comprises the lower order bits of the address. The combination of the selected row and column indications address a selected pixel of active matrix display array 14. In an alternate embodiment, the first portion may indicate a selected column and the second portion may indicate a selected row.

The stored row address value from row address buffers 8 may be coupled to row decoder 13. In a similar manner, the column address value from column address buffers 7 may be coupled to column decoder 9. Both row decoder 13 and column decoder 9 convert a binary address value into individual select signals in a well-known manner. Row decoder 13 outputs a plurality of row select signals 15 that may be applied to active matrix display array 14. Column decoder 9 outputs a plurality of column select signals 17 that are coupled to sense amplifiers input/output (I/O) gating 11. Both row decoder 13 and column decoder 9 have individual output select signals based on binary address values input to the decoders such that only one pixel in the active matrix display array will be selected for a given combination of row and column binary address values. Sense amplifiers I/O gating 11 may be coupled to active matrix display array 14 by a plurality of bidirectional column I/O connections 16. Sense amplifiers I/O gating 11 uses the plurality of bidirectional column I/O signals 16 to control the reading or writing of data into active matrix display array 14. Data may be coupled between the data bus 5 and sense amplifiers I/O gating 11 through data in buffer 10 for data write operations and through data out buffer 12 for data read operations.

Figure 3:
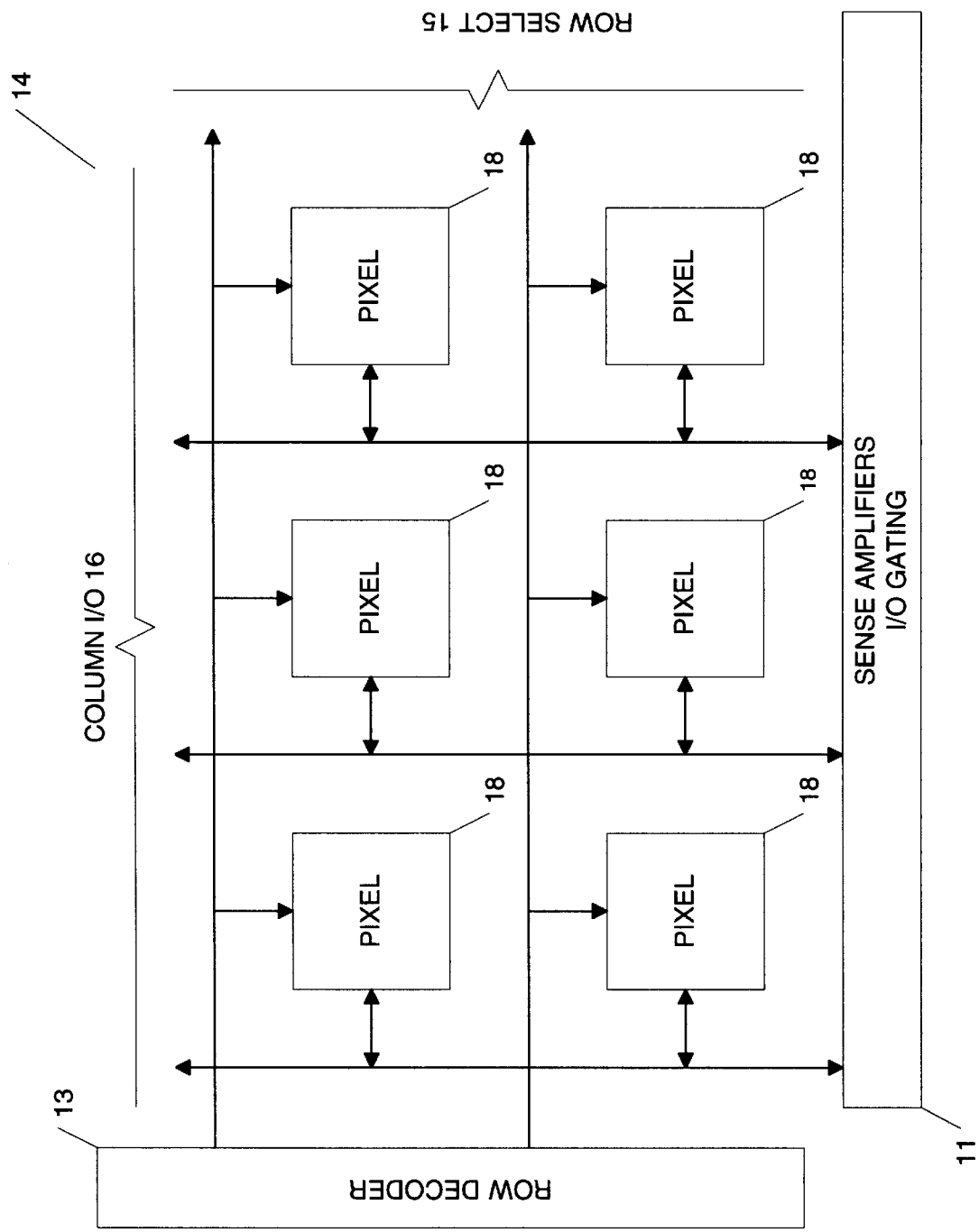
FIG. 3 is a diagram of an array of pixels with row select lines and column I/O connections within the matrix addressable display device of FIG. 2.

FIG. 3 is a diagram of active matrix display array 14. Each individual row select signal 15 may be received by all of the individual pixels in a given row of active matrix display array 14. Each individual column I/O signal 16 may be connected to all of the individual pixels in a given column of active matrix display array 14. When a given row select 15 signal is activated, all of the pixels on the given row are activated and can perform either a read or a write operation. The particular pixel to be read from or written to may be selected by an active column I/O signal 16 in conjunction with the row select signal.

Figure 4:
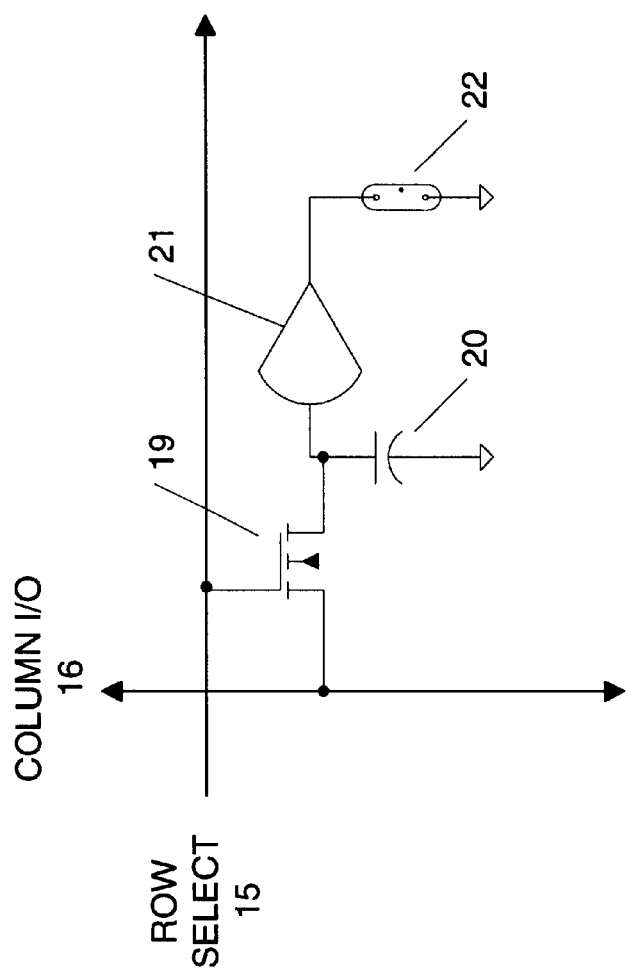
FIG. 4 is a diagram of an individual display pixel according to an embodiment of the present invention.

FIG. 4 is a diagram of an individual pixel 18 in the active matrix display array. When a given row select signal 15 is active, transistor 19 conducts, connecting column I/O signal 16 to the pixel circuit. During a pixel write operation, the electrical voltage present on column I/O signal 16 is gated through transistor 19 and stored on capacitor 20. After this voltage is stored on capacitor 20, row select signal 15 may be de-asserted, causing transistor 19 to become non-conducting so that the voltage stored on capacitor 20 will remain. The voltage stored on capacitor 20 is isolated by analog buffer 21 and used to drive visible actuating element 22 that translates the electrical voltage into a visible image for the pixel. During a pixel read operation, a particular row select signal 15 may be activated, causing transistor 19 to conduct. The voltage stored on capacitor 20 may then be coupled to column I/O signal 16 for transfer through sense amplifiers I/O gating 11 and data out buffer 12.

Figure 5:
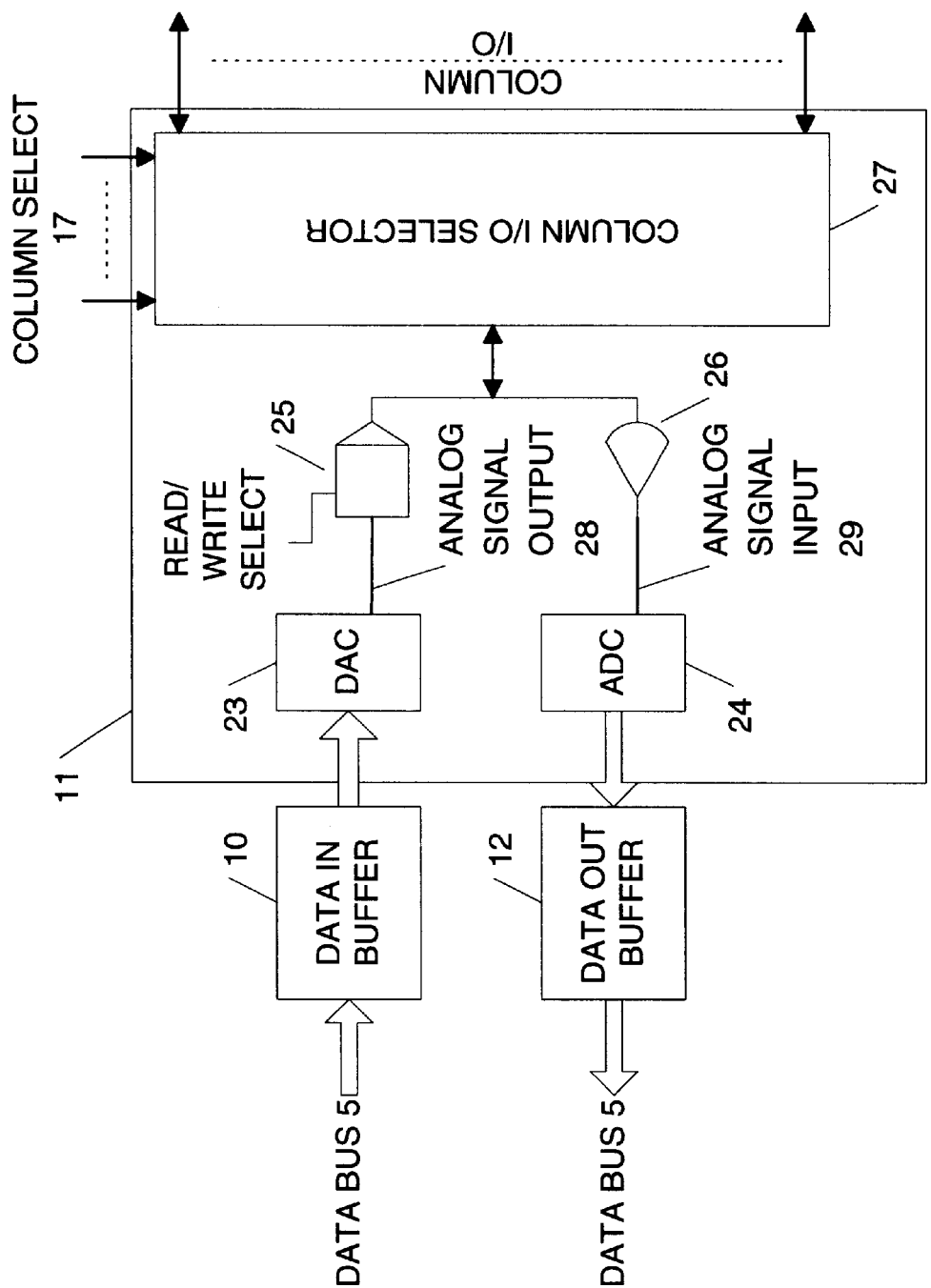
FIG. 5 is a diagram of the column I/O interface according to an embodiment of the present invention.

FIG. 5 is a diagram of the column I/O interface including the sense amplifiers I/O gating circuitry 11 according to an embodiment of the present invention. Data in buffer 10, data out buffer 12, and data bus 5 are included for clarity. During a pixel write operation, binary information from data bus 5 may be stored in data in buffer 10 and converted from binary format to an analog voltage by digital-to-analog converter (DAC) 23 to produce analog signal output 28. Analog signal output 28 may be gated through analog buffer driver 25 and applied to column I/O selector 27. Bi-directional column I/O selector 27, a well-known analog circuit, uses the individual column select 17 signals to enable one of the possible column I/O connections. The analog signal output 28 may thus be coupled to a single column of pixels.

During a pixel read operation, the analog voltage stored on the capacitor 20 in each pixel 18 in the selected row is present on its column I/O 16 connection. Column select 17 signals gate one of the column I/O 16 voltages through to buffer amplifier 26 to produce analog signal input 29. The voltage level of the analog signal input 29 may be converted into binary format by analog-to-digital converter (ADC) 24. The binary representation of the analog signal input 29 may be stored in data out buffer 12 and coupled to data bus 5 for access by a processor.

Although in the embodiment of FIGS. 3 and 4, only one column I/O connection per pixel is shown, each pixel may have multiple column I/O connections and each pixel may comprise more than a single electrical voltage to visible image translator.

As described, the display device in accordance with one embodiment of the present invention communicates directly with a processor via a bus, without the need for an intermediate display memory device such as VRAM, for example, or a graphics controller circuit. Information communicated from the processor to the display device is directly presented in a visual fashion. The processor may read the visual information stored in the matrix addressable display device. The matrix addressable display device is able to retain the visual information without the need for continuous refresh operations. Individual pixels of the display may be selectively written by the processor. Furthermore, because individual pixels may be selectively written, pixels may be written only when their corresponding values have changed, thereby providing better display update performance.

An apparatus has been disclosed for allowing a processor to directly perform both data read and write operations with a display device, the display device being able to retain and display the visual information stored in the display device without continual, external refresh operations.

While this invention has been described with reference to illustrative embodiments, this description is not intended to be construed in a limiting sense. Various modifications of the illustrative embodiments, as well as other embodiments of the invention, which are apparent to persons skilled in the art to which the inventions pertains are deemed to lie within the spirit and scope of the invention.

What is claimed is:

1. A computer system comprising:
    a computer display device; and
    a microprocessor connected to the computer display device to electronically read pixel data from and electronically write pixel data to the computer display device without using a video random access memory (VRAM), wherein the microprocessor is directly connected to the computer display device without use of a graphics controller circuit.

2. The computer system of claim 1, wherein the computer display device comprises a matrix addressable display.

3. The computer system of claim 2, wherein the matrix addressable display comprises a liquid crystal display.

4. The computer system of claim 2, wherein the matrix addressable device comprises a light emitting polymer display.

5. The computer system of claim 2, wherein the matrix addressable device comprises a reflective silicon display.

6. The computer system of claim 1, wherein the computer display device comprises a plurality of pixels and the microprocessor electronically writes display data to selected individual pixels.

7. The computer system of claim 1, wherein the computer display device comprises a plurality of pixels and the microprocessor electronically reads display data from selected individual pixels.

8. The computer system of claim 1, wherein the computer display device comprises a plurality of pixels that persistently hold intensity values without requiring continual refreshing.

9. The computer system of claim 8, wherein the microprocessor writes display data only to selected individual pixels having intensity values to be changed, the selected pixels being less than all pixels of the computer display device.

10. The computer system of claim 8, wherein each pixel comprises a capacitor to store the intensity value of the pixel.

11. The computer system of claim 10, wherein the computer display device comprises circuitry to read the intensity value stored in a selected one of the capacitors and to electronically send the intensity value to the microprocessor.

12. In a computer system having a microprocessor connected to a matrix addressable display device having a plurality of pixels, a method comprising:
    electronically reading display data by the microprocessor from selected individual pixels of the matrix addressable display device; and
    writing display data by the microprocessor to selected individual pixels of the matrix addressable display device having intensity values to be changed, the selected pixels being less than all pixels of the matrix addressable display device.

13. A matrix addressable display device comprising:
    a plurality of individually addressable pixels electronically and selectively readable by a microprocessors;
    address logic coupled to the plurality of pixels for decoding an address to select a pixel; and
    a second buffer coupled to the address logic for storing display data to be written to the selected pixel.

14. The matrix addressable display device of claim 13, further comprising a first buffer coupled to the address logic for storing display data read from the selected pixel.

15. The matrix addressable display device of claim 13, wherein the plurality of pixels comprise an array and wherein the address logic comprises:
    a row-column address de-multiplexor to receive the address;
    a row decoder coupled to the row-column address de-multiplexor to identify a selected row of the array; and
    a column decoder coupled to the row-column address de-multiplexor to identify a selected column of the array.

16. The matrix addressable display device of claim 13, wherein each pixel comprises a capacitor to store an intensity of the pixel.

17. The matrix addressable display device of claim 13, wherein the plurality of pixels comprise an array of pixels, each pixel being individually addressable by a combination of a row select signal and a column select signal, and wherein each pixel comprises:
    a transistor coupled to a row select signal and a column select signal;
    a capacitor coupled to the transistor to store a voltage present on the column select signal;

a buffer coupled to the capacitor to isolate the voltage received from the capacitor; and a visible actuating element coupled to the buffer to translate the voltage into a visible image.

18. The matrix addressable display device of claim 13, further comprising means for decoding an address to select a pixel.

19. The matrix addressable display device of claim 18, further comprising means for storing display data read from the selected pixel.

20. The matrix addressable display device of claim 18, further comprising means for storing display data to be written to the selected pixel.

21. The matrix addressable display device of claim 18, wherein the plurality of pixels comprise an array and wherein the address decoding means comprises:

means for receiving the address;

means for identifying a selected row of the array based on the address; and means for identifying a selected column of the array based on the address.

22. A system comprising:

a microprocessor; and a display device connected to the microprocessor;

wherein said microprocessor is adapted to output display addresses and display data to the display device, and wherein the display device is adapted to display a visual representation of the display data, without using an intermediate display memory device or a graphics controller circuit; to retain said visual representation of the display data, without need for external display refresh operations; and to allow the microprocessor to electronically read the display data directly from the display device.

23. The system of claim 22, wherein the display device further comprises:

an active matrix display array comprising a plurality of pixels; and an I/O gating circuit coupled to the active matrix display array.

24. The system of claim 23, wherein each of said pixels is adapted to translate an electrical signal into a visible image.

25. The system of claim 23, wherein each of said pixels comprises:

a transistor activated by a row select signal, wherein the transistor acts as a gate to link the pixel to a column I/O connection;

a capacitor to store a voltage representing the display data;

an analog buffer to provide a drive voltage based on the voltage; and an element to translate the drive voltage into a visible image.

26. The system of claim 23 wherein the I/O gating circuit comprises:

a bidirectional, column I/O selector circuit to select a column I/O connection to a selected pixel of the plurality of pixels;

a buffer driver circuit coupled to the column I/O selector circuit to output a voltage to the selected pixel; and a buffer amplifier circuit coupled to the column I/O selector circuit to accept a voltage from the selected pixel.

* * * * *

UNITED STATES PATENT AND TRADEMARK OFFICE
CERTIFICATE OF CORRECTION

PATENT NO.     : 6,597,329 B1                                                Page 1 of 1
DATED          : July 22, 2003
INVENTOR(S)    : Moss It is certified that error appears in the above-identified patent and that said Letters Patent is hereby corrected as shown below:

Column 6,
Line 36, delete "microprocessors" and insert -- microprocessor --.

Signed and Sealed this

Twenty-fourth Day of February, 2004

JON W. DUDAS
*Acting Director of the United States Patent and Trademark Office*